United States Patent
Zellner et al.

(10) Patent No.: US 8,027,022 B2
(45) Date of Patent: Sep. 27, 2011

(54) PROJECTION OBJECTIVE

(75) Inventors: Johannes Zellner, Aalen (DE);
Hans-Juergen Mann, Oberkochen (DE); Wilhelm Ulrich, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 507 days.

(21) Appl. No.: 12/174,131

(22) Filed: Jul. 16, 2008

(65) Prior Publication Data
US 2009/0027644 A1    Jan. 29, 2009

Related U.S. Application Data

(60) Provisional application No. 60/951,511, filed on Jul. 24, 2007.

(30) Foreign Application Priority Data

Jul. 24, 2007   (DE) .......................... 10 2007 034 905

(51) Int. Cl.
*G03B 27/42* (2006.01)

(52) U.S. Cl. ........................................... 355/53; 355/67

(58) Field of Classification Search .................... 355/53, 355/67
See application file for complete search history.

(56) References Cited

U.S. PATENT DOCUMENTS

| | | | |
|---|---|---|---|
| 4,408,874 A | 10/1983 | Zinky et al. | |
| 5,153,898 A | 10/1992 | Suzuki et al. | |
| 6,353,470 B1 | 3/2002 | Dinger | |
| 6,577,443 B2 | 6/2003 | Dinger et al. | |
| 6,660,552 B2 | 12/2003 | Payne et al. | |
| 6,710,917 B2 | 3/2004 | Mann et al. | |
| 6,902,283 B2 | 6/2005 | Dinger | |
| 6,922,291 B2 | 7/2005 | Sunaga et al. | |
| 6,947,210 B2 | 9/2005 | Terasawa | |
| 7,070,289 B2 | 7/2006 | Sasaki et al. | |
| 7,114,818 B2 | 10/2006 | Minakata | |
| 2002/0056815 A1* | 5/2002 | Mann et al. | 250/492.2 |
| 2002/0114089 A1* | 8/2002 | Dinger et al. | 359/853 |
| 2003/0043455 A1 | 3/2003 | Singer et al. | |
| 2004/0189968 A1 | 9/2004 | Terasawa | |
| 2007/0058269 A1 | 3/2007 | Mann et al. | |

FOREIGN PATENT DOCUMENTS

| | | |
|---|---|---|
| DE | 195 02 827 B4 | 8/1995 |
| DE | 102 12 405 | 10/2002 |
| DE | 103 59 576 | 7/2005 |
| DE | 103 60 414 A1 | 7/2005 |
| DE | 103 60 581 A1 | 7/2005 |

(Continued)

OTHER PUBLICATIONS

Office Action for corresponding Application No. JP 2008-529565, dated Dec. 7, 2009.

(Continued)

*Primary Examiner* — Edward Glick
*Assistant Examiner* — Mesfin T Asfaw
(74) *Attorney, Agent, or Firm* — Fish & Richardson P.C.

(57) ABSTRACT

The disclosure relates a projection objective for imaging an object field in an object plane into an image field in an image plane. The disclosure also relates to a microlithographic projection exposure apparatus including such a projection objective. The disclosure further relates to methods of using such a projection exposure apparatus to fabricate microstructured or nanostructured components, such as highly integrated semiconductor components. In addition, the disclosure relates to components fabricated by such methods.

21 Claims, 3 Drawing Sheets

FOREIGN PATENT DOCUMENTS

| | | |
|---|---|---|
| EP | 1 333 260 A2 | 8/2003 |
| EP | 1 335 228 A1 | 8/2003 |
| EP | 1 434 093 | 6/2004 |
| JP | 2002-139672 | 5/2002 |
| JP | 2003-222572 | 8/2003 |
| JP | 2003-233002 | 8/2003 |
| JP | 2004-029625 | 1/2004 |
| JP | 2004-512552 | 4/2004 |
| JP | 2004-516500 | 6/2004 |
| JP | 2004-214242 | 7/2004 |
| JP | 2004-525398 | 8/2004 |
| JP | 2005-055553 | 3/2005 |
| WO | WO 02/48796 | 6/2002 |
| WO | WO 02/056114 | 7/2002 |
| WO | WO 2004/010224 | 1/2004 |

OTHER PUBLICATIONS

Bal, Matthieu Frédéric, dissertation "Next-Generation Extreme Ultraviolet Lithographic Projection Systems", pp. 1-139, (Feb. 10, 2003).

Paul, "Lexikon der Optik," Spektrum Akademischer Verlag Heidelberg Berlin, 2003, English Abstract attached.

English translation of Office Action for corresponding Application No. JP 2008-529565, dated Feb. 21, 2011.

\* cited by examiner

PROJECTION OBJECTIVE

CROSS-REFERENCE TO RELATED APPLICATIONS

This application claims priority under 35 U.S.C. §119(e)(1) to U.S. Provisional Application No. 60/951,511, filed Jul. 24, 2007. This applications also claims priority under 35 U.S.C. §119 to German Patent Application DE 10 2007 034 905.1, filed Jul. 24, 2007. The contents of both of these applications are hereby incorporated by reference.

FIELD

The disclosure relates a projection objective for imaging an object field in an object plane into an image field in an image plane. The disclosure also relates to a microlithographic projection exposure apparatus including such a projection objective. The disclosure further relates to methods of using such a projection exposure apparatus to fabricate microstructured or nanostructured components, such as highly integrated semiconductor components. In addition, the disclosure relates to components fabricated by such methods.

BACKGROUND

Projection objectives are known. In some projection objectives, the illumination light is to be guided using as few bundle-guiding components as possible to avoid a loss of illumination light and/or imaging light. In the following description, the term illumination light refers to light or radiation, respectively, which is guided in the projection exposure apparatus from the radiation source to the image field. More specifically, imaging light refers to that part of the illumination light which, starting from the object field, reaches the image field after being guided through the projection objective.

SUMMARY

In some embodiments, the disclosure provides a projection objective that can provide extremely high structural resolution, which can be used, for example, for the fabrication of microstructured or nanostructured components. In certain embodiments, the disclosure provides a projection objective that can provide efficient illumination. In some embodiments, the disclosure provides a projection objective that is relatively compact (e.g., has a relatively small installation height). Embodiments can exhibit more than one (e.g., all) of these features.

In certain embodiments, the disclosure provides a projection objective for imaging an object field in an object plane into an image field in an image plane, such as for imaging an object which is reflective of imaging radiation. The projection objective includes a structure to be imaged which is disposed in the object field. The projection objective includes a grazing incidence mirror which forms the first bundle-guiding element of the projection objective and is disposed downstream of the object plane in the imaging beam path of the projection objective. The projection objective also includes at least one normal incidence mirror which is disposed downstream of the grazing incidence mirror in the imaging beam path of the projection objective.

The disclosure is based, in part at least, on the observation that certain disadvantageous features associated with a relatively large installation height, such as can occur in arrangements according to those shown in FIG. 7 of WO 2004/010 224 A2, can be avoided if the grazing incidence mirror is disposed directly behind the object plane, thus acting as a component of the projection objective. This can enable illumination light to be guided from the illumination optics to the object plane at a less steep angle relative to the image plane. In other words, the use of the grazing incidence mirror, which is disposed according to the disclosure, can result in that the main direction of bundle guidance of the illumination optics tilts away from the normal and into the image plane. At a given distance between the entrance pupil and the object plane, a bundle-guiding component disposed at the position of this entrance pupil may then be arranged at a higher level relative to the level of the image plane as it is for example the case in the arrangement according to FIG. 7 of WO 2004/010 224 A2. Likewise, the other upstream components of the illumination system may then be arranged at a correspondingly higher level, with the result that the installation height of the entire apparatus, in particular of the projection exposure apparatus, is reduced accordingly. In particular, this enables an arrangement to be obtained in which light is directly guided to the object plane by a bundle-guiding component which is arranged in the entrance pupil of the projection objective. The disclosure therefore can offer particular advantages in projection objectives with a negative back focus of the entrance pupil, which means that the entrance pupil of the projection objective is arranged in the beam path in front of the object plane. The use of a grazing incidence mirror usually results in the object plane no longer running parallel to the image plane, which may easily be achieved by adapting the mechanical design. The projection objective typically have at least two mirrors, more specifically a grazing incidence mirror and a normal incidence mirror. The projection objective may however also be equipped with a higher number of mirrors, for example three, four, five or even more mirrors. Often, the number of mirrors is such that a given structural resolution is obtained with as few mirrors as possible.

The projection objective may have exactly six normal incidence mirrors, thus including a total of seven mirrors, including the one grazing incidence mirror. A projection objective of this type enables a very high structural resolution to be obtained despite a moderate number of mirrors.

Between an object principal beam portion of a principal beam of a central object field point between the object field and the grazing incidence mirror and an image principal beam portion of the principal beam directly in front of the image plane, there may be an angle which exceeds 20°. Due to such a tilting angle, the illumination and imaging light is guided in a way that the principal beam guidance direction of the illumination optics in front of the object plane tilts away from a normal and into the image plane. This can result in the same advantages which have already been described above in relation to the projection objective.

The numerical aperture of the projection objective on the side of the image field may amount to 0.3, which can result in a correspondingly high structural resolution of the projection objective.

The projection objective may have an image field with a surface area of at least 1 mm$^2$. The image field may for example have a surface area of 2 mm×26 mm. When used in a projection exposure apparatus, holding devices for the object and for the substrate onto which the structure on the object is imaged may be designed such that the object on the one hand and the substrate on the other are displaced in a direction perpendicular to the short field dimension during a process of projection exposure. An image field with a surface area exceeding 1 mm$^2$ results in a high throughput during a projection exposure.

In some embodiments, the disclosure provides a projection exposure apparatus designed so that guidance of the illumination light is achieved with a low number of bundle-guiding components while at the same time ensuring a low installation height.

In certain embodiments, the disclosure provides a microlithographic projection exposure apparatus including an illumination system for guiding illumination light from a radiation source to an object plane and for defined illumination of an object field in the object plane. The microlithographic projection exposure apparatus also includes a projection objective for imaging the object field into an image field in an image plane.

The advantages of a projection exposure apparatus of this type are generally equivalent to those already described above in relation to the projection objective.

An angle in the projection exposure apparatus of less than 60° between the last axis portion of an optical axis in front of the object plane and the image plane, wherein the axis portion is located between the last bundle-guiding element of the illumination system and the object plane, enables the components of the illumination system to be installed at a particularly low installation height. The installation height can be reduced even more by way of an angle which is less than 50° or by way of an angle which is less than 45°. In this respect, the angle between the axis portion of the optical axis and the image plane is the angle between a straight line which extends the axis portion in the direction towards the image plane and the image plane. This angle is defined as the smaller angle between the straight line and the vertical projection thereof on the image plane.

An additional grazing incidence mirror in the illumination system which forms the last bundle-guiding element of the system which is disposed upstream of the object plane in the beam path of the illumination light offers the possibility of achieving an even less steep principal beam guidance in the area of the illumination system disposed upstream of the grazing incidence mirror, which can result in another substantial reduction of the installation height.

The advantages of an angle of less than 45° between an axis portion of an optical axis and the image plane, wherein the axis portion is located between the last bundle-guiding element of the illumination system and the additional grazing incidence mirror are generally equivalent to those described above in relation to the embodiment including an angle in the projection exposure apparatus of less than 60° between the last axis portion of an optical axis in front of the object plane and the image plane, wherein the axis portion is located between the last bundle-guiding element of the illumination system and the object plane. The angle definition is equivalent as well. Optionally, the angle between the last axis portion in front of the additional grazing incidence mirror and the image plane is less than 40°, such as in the range of 30°.

Angles of incidence of the illumination light on the grazing incidence mirror according which are greater than 70°, such as greater than 80°, can result in a bundle guidance with a very low amount of loss. This is advantageous in particular for EUV radiation.

A grazing incidence mirror having a reflecting freeform surface in particular can allow a correction of imaging errors or bundle guidance errors, respectively, that occur in the projection exposure apparatus. In particular the grazing incidence mirror arranged between the object plane and the image plane may be formed like a correction asphere. This correction asphere may be formed in the course of the design process or on the basis of a measurement performed to determine an illumination light wavefront in one of the field planes of the projection objective, for example, or to determine another suitable parameter describing the imaging quality. If the correction asphere is formed on the basis of an imaging quality measurement, the component installed in the light path of the projection exposure apparatus which is intended to form the correction asphere, i.e. the grazing incidence mirror in the present example, is demounted for optical surface adaptation or is replaced by a correspondingly adapted copy of this component. Methods of defining the shape of the optically active surface of such a correction asphere are described in DE 103 60 581 A1 and in DE 103 60 414 A1. Examples of characterizing a freeform surface are set forth in US 2007/0058269 A1. Since a grazing incidence mirror usually has a coating including only one layer or only few layers; adaptation of such a mirror, in particular an overcoating of such a mirror, is therefore possible without involving an excess amount of effort. Compared to the formation of a component reflecting at a steeper angle of incidence, adaptation of a grazing incidence mirror is easier since these components are usually equipped with multiplayer coatings.

A wavefront error of the projection objective which is less than or equal to 15 m$\lambda$ can enable a particularly high-quality projection to be achieved which allows for extremely small structures to be imaged. In general, wavefront errors are achievable which are less than 100 m$\lambda$ (e.g., less than 70 m$\lambda$, less than 50 m$\lambda$, less than 30 m$\lambda$).

In certain embodiments, the disclosure provides a fabrication method for a microstructured component as well as a microstructured component in which the advantages of the projection exposure apparatus can become apparent.

In some embodiments, the method includes: providing a projection exposure apparatus; providing a reticle in the object field, the reticle having a pattern to be imaged; and imaging the pattern via the projection exposure apparatus onto an illumination-light sensitive coating of a wafer.

In certain embodiments, the disclosure provides a microstructured component.

BRIEF DESCRIPTION OF THE DRAWINGS

Embodiments of the disclosure will hereinafter be described in more detail by the drawings in which.

DETAILED DESCRIPTION

Figure 1:
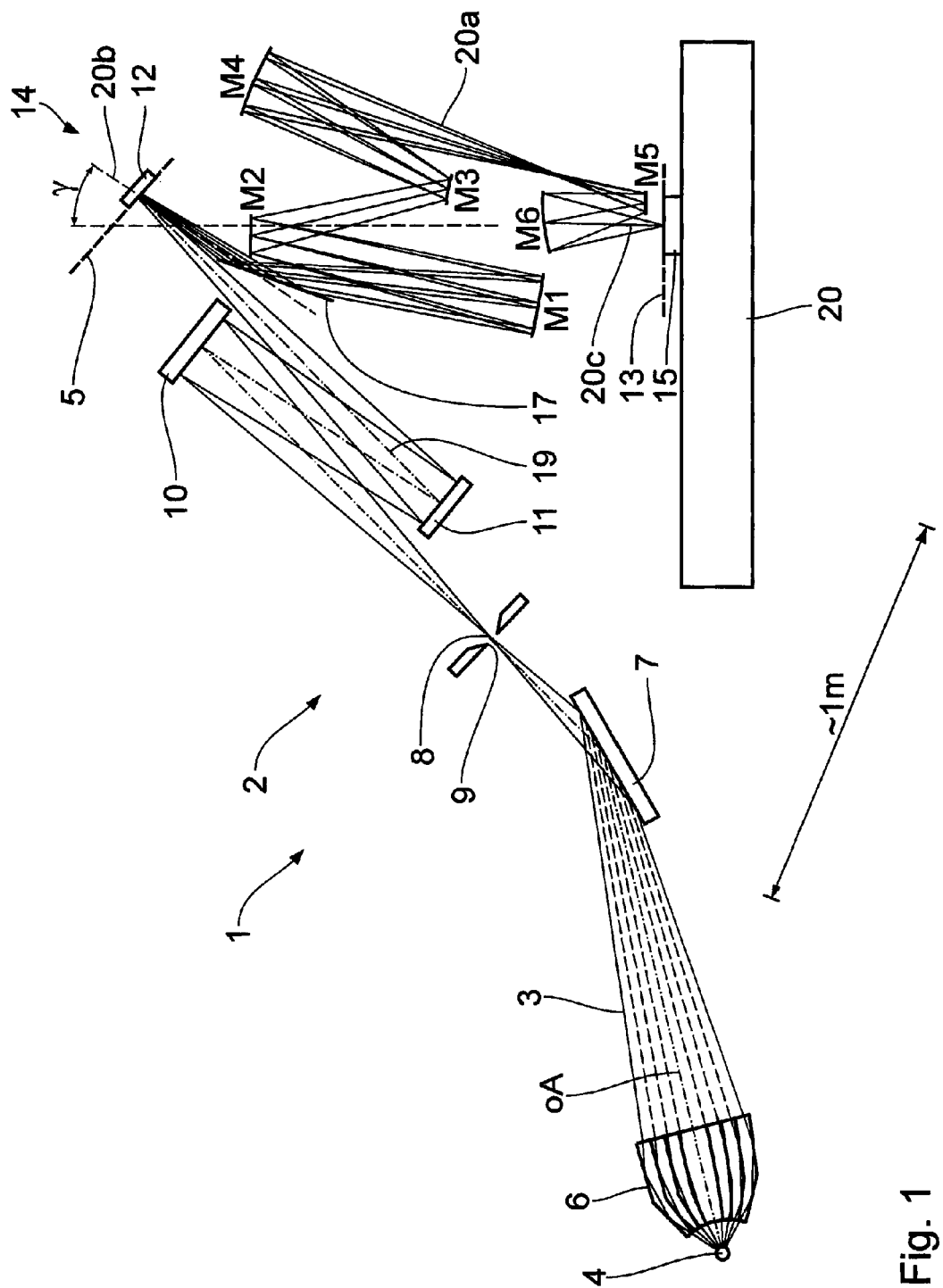
FIG. 1 shows a schematic view of the bundle-guiding components of a microlithographic EUV projection exposure apparatus including an illumination system and a projection objective.

A microlithographic projection exposure apparatus 1 shown schematically in FIG. 1 includes an illumination system 2 for guiding illumination light 3 from a radiation source 4 to an object plane 5 of the projection exposure apparatus 1. The illumination light 3 is schematically indicated by way of some selected illumination rays. In the displayed embodiment, the illumination light 3 is EUV radiation in a wavelength range of between 10 nm and 30 nm, such as between 5 nm and 30 nm. Thus in this case, the radiation source 4 is an EUV radiation source, for example a gas discharge source.

Illumination light 3 emitted by the radiation source 4 is initially bundled by a collector 6. The collector 6 is shown as a nested grazing incidence collector which is disclosed in US 2003/0043455 A, for example.

Downstream of the collector 6, the bundled illumination light 3 initially hits a spectral filter 7 in the form of a grating which is impinged at a grazing angle of incidence. By way of the spectral filter 7, the first order of diffraction of the illumination light 3 is selected, for example. An intermediate focus 8 is disposed downstream of the spectral filter 7, with an aperture diaphragm 9 which is arranged at the position thereof and acts as a spatial filter.

Downstream of the intermediate focus 8, the illumination light 3 hits a field facet mirror 10 which has a plurality of raster elements. The illumination light 3 hits the field facet mirror 10 at an angle of incidence, i.e. at an angle relative to the surface normal of the mirror plane, which is less than 20°.

After reflection by the field facet mirror 10, the illumination light 3 hits a pupil facet mirror 11. Likewise, the angle of incidence of the illumination light 3 when hitting the pupil facet mirror 11 is also less than 20°. Downstream of the pupil facet mirror 11, the illumination light 3 hits a reflecting reticle 12 disposed in the object plane 5. The reticle 12 carries a structure to be imaged in the microlithographic process.

Up to this point, the described arrangement of the illumination system 2 in particular serves for defined illumination of an object field in the object plane 5 in which the structure to be imaged is disposed.

A projection objective 14 serves for imaging the object field into an image field in an image plane 13. The projection objective 14 is shown on an enlarged scale in FIG. 2. A wafer 15 onto which the structure to be imaged is imaged by the projection objective 14 is disposed in the image plane 13.

The reticle 12 and the wafer 15 are carried by holding members which are not described in detail. The projection exposure apparatus 1 may be designed like a scanner. The projection exposure apparatus 1 may however also be designed like a stepper. In general, in the scanner version, the holding members are synchronously displaced in a continuous manner during the illumination process. Typically, in the stepper version, the holding members are stationary during each illumination process.

Figure 2:
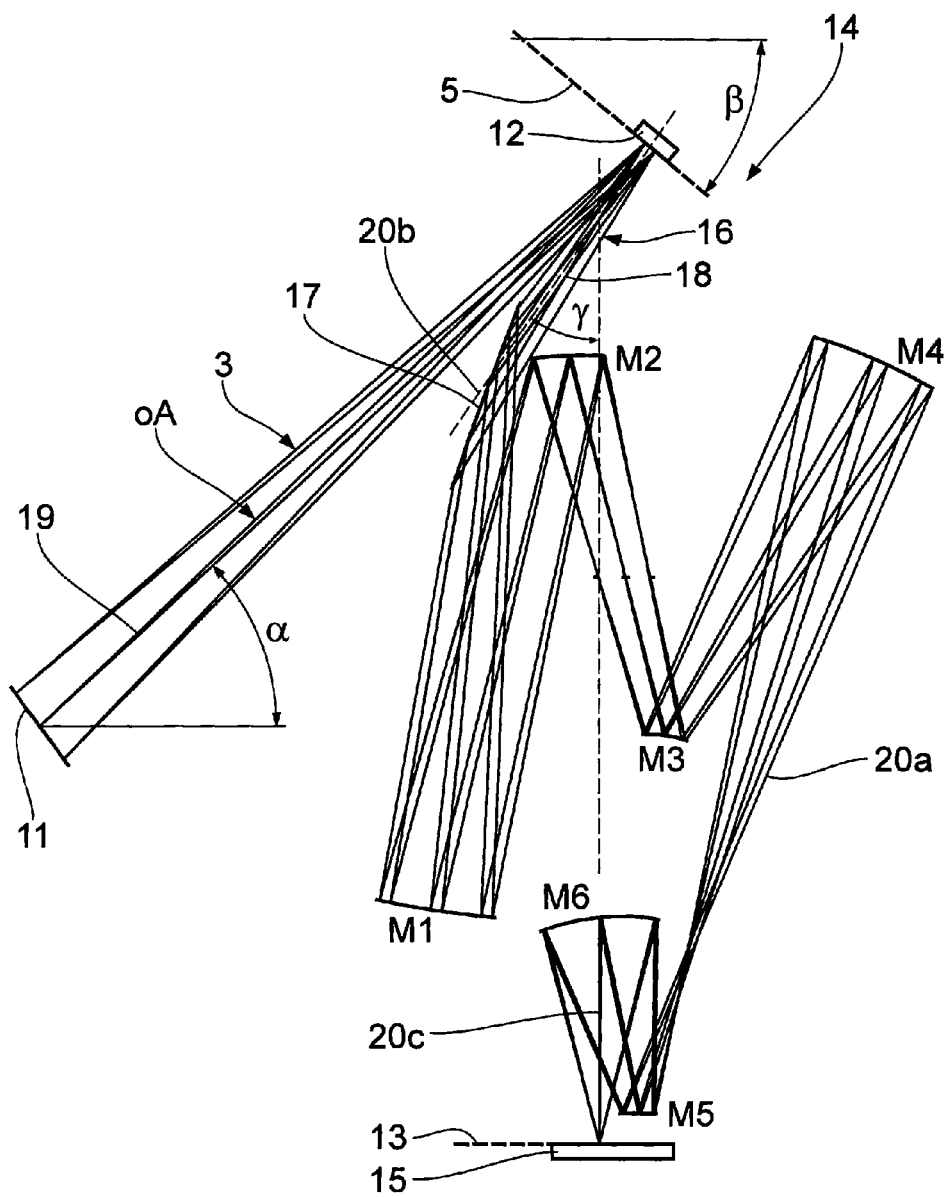
FIG. 2 shows an enlarged view of an imaging beam path of the projection objective of the projection exposure apparatus according to FIG. 1, starting from an entrance pupil of the projection objective.

The object plane 5 is tilted relative to the image plane 13 by an angle β of approximately 40° about an axis which is perpendicular to the drawing plane of FIGS. 1 and 2.

Disposed downstream of the object plane 5 along an imaging beam path 16 of the illumination light 3, the first bundle-guiding element of the projection objective 14 is a grazing incidence mirror 17. A central principal beam 18 of the imaging beam path 16, more specifically of an imaging path that runs through the center of a pupil of the projection objective 14 and is assigned to a central field point, hits the grazing incidence mirror 17 at an angle of incidence of approximately 75°. Other angles of incidence exceeding 70°, in particular angles of incidence exceeding 80°, are conceivable as well. The grazing incidence mirror 17 is followed by six other mirrors in the projection objective 14 which are denoted by M1 to M6 in the drawing, corresponding to their order of arrangement in the imaging beam path 16. A pupil plane of the projection objective 14 is spatially disposed in the region between the mirrors M2 and M3. The mirrors M1, M4 and M6 are concave mirrors. The mirror M2 is a mirror with a substantially plane reflection surface. The mirrors M3 and M5 are convex mirrors. The central principal beam 18 hits the mirrors M1 to M6 at angles of incidence amounting to a maximum of 25°. Designs with smaller maximum angles of incidence are conceivable as well, for example designs with maximum angles of incidence of the central principal beam 18 which are less than 20°.

The grazing incidence mirror 17 may have a plane reflection surface. Alternatively, the grazing incidence mirror 17 may also be created such as to have an imaging effect. In particular, the grazing incidence mirror 17 may have a free-form surface acting as reflection surface which is formed such as to correct imaging errors of the projection objective 14 so as to reduce the wavefront error of the projection objective 14. When using a plane grazing incidence mirror 17, the projection objective 14 has a wavefront error in the range of rms≈15 mλ.

The optical axis oA hits the reflecting reticle 12 in the object plane 5 at an angle of incidence of approximately 6°. This angle of incidence and the object plane 5, which is tilted by the angle β, define an angle alpha of approximately 45° between an axis portion 19 of the optical axis oA and the image plane 13, the axis portion 19 being located between the pupil facet mirror 11 and the object plane 5, thus forming last bundle-guiding component of the illumination system. Other angles alpha which are less than 60°, such as alpha=55° or alpha=50°, are conceivable as well.

This angle alpha results in that the radiation source 4 is approximately at the same level as a support frame 20 of the projection objective 14. The entire projection exposure apparatus 1 may therefore be installed at the same level of installation without requiring further deflection elements for the illumination light 3 in addition to those shown in FIG. 1.

Each of the mirrors M1 to M6 is a normal incidence mirror. Therefore, all individual rays 20*a* in the imaging beam path 16 hit the mirrors M1 to M6 at an angle of incidence which is less than 30°. In some or even all mirrors M1 to M6, the angle of incidence of all individual rays 20*a* is even less than 25°, less than 20°, less than 15° or even less than 10°. This design of the mirrors M1 to M6 as normal incidence mirrors facilitates application of reflection coatings on the reflection surfaces of the mirrors M1 to M6 so as to achieve an optimized transmission of the projection objective 14. In particular when EUV radiation is used as illumination light 3, the reflection coatings on the mirrors of the projection objective 14 may be configured as multiplayer coatings which enable a particularly high reflectivity to be achieved if all individual rays 20*a* hit the respective reflection coating at angles of incidence in the smallest possible tolerance range. This is achieved if the mirrors M1 to M6 are designed as normal incidence mirrors.

The optical axis oA coincides with a principal beam of a central field point in the projection objective 14. An object principal beam portion 20*b* between the object field in the object plane 5 and the grazing incidence mirror 17 and an image principal beam portion 20*c* between the mirror M6 and the image field in the image plane 13, i.e. directly in front of the image plane define a tilting angle gamma which amounts to approximately 33° in the projection objective 14 and therefore in particular exceeds 20°. The tilting angle gamma enables the axis portion 19 of the optical axis oA to be configured such as to extend towards the image plane 13 at an angle alpha of approximately 45°. Other angles gamma which amount to at least 20° are conceivable as well, such as gamma=20°, gamma=25° or gamma=30°. Likewise, even larger angles gamma are also conceivable.

The projection objective 14 has a numerical aperture of 0.3 on the side of the image field. In particular a larger numerical aperture of for example 0.4 or 0.5 or an even larger numerical aperture is conceivable as well. The projection objective 14 has a partially annular image field in the image plane 13 with a image field size of 2 mm×26 mm, with the shorter field dimension extending in the horizontal direction in FIG. 2. The longer field dimension of the image field extends perpendicular to the drawing plane of FIG. 2.

Figure 3:
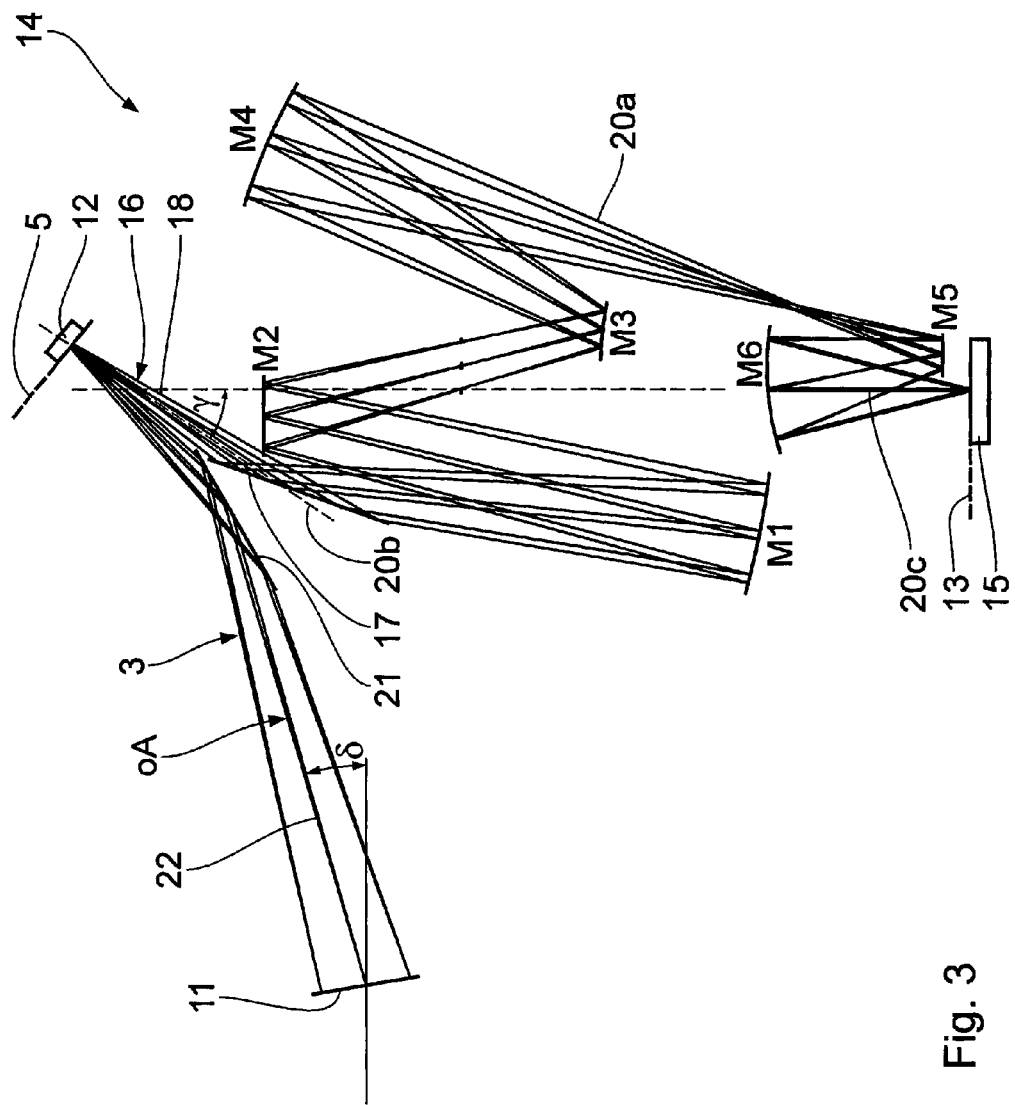
FIG. 3 shows an imaging beam path of a projection exposure apparatus including an alternative illumination system in a representation similar to that of FIG. 2.

In a representation similar to that of FIG. 2, FIG. 3 shows an alternative bundle guidance of illumination light 3 from the pupil facet mirror 11 of the illumination system 2. Components which are equivalent to those described above in relation to FIGS. 1 and 2 are denoted by the same reference numerals and are not described in detail again.

In addition to the bundle-guiding components of the illumination system 2 according to FIGS. 1 and 2, the illumination system 2 according to FIG. 3 includes another grazing incidence mirror 21 between the pupil facet mirror 11 and the reticle 12. The illumination light 3 hits the additional grazing incidence mirror 21 at an angle of incidence which is equivalent to the angle of incidence on the grazing incidence mirror 17 in the projection objective 14. These two angles of incidence may however also be different from one another. The deflecting effect of the additional grazing incidence mirror 21 allows an angle delta of an axis portion 22 of the optical axis oA to be reduced to approximately 30°, the angle delta being located between the pupil facet mirror 11 and the additional grazing incidence mirror 21.

Although designed in the same way, the illumination system 2 in front of the pupil facet mirror 11 may be tilted by the difference of the angles delta and alpha such that the radiation source 4 is disposed at an even higher level compared to the arrangement of FIG. 1, thus providing for an even easier assembly of the entire projection exposure apparatus 1 on one and the same level of installation.

Likewise, the additional grazing incidence mirror 21 may also have a reflecting freeform surface, in particular for altering the illumination of the object field in the object plane 5. Alternatively, the additional grazing incidence mirror 21 may also be a plane mirror.

Fabrication of a microstructured component takes place via the reticle 12 including the structure, more specifically the pattern, to be imaged which is positioned in the object field in the object plane 5. The wafer 15 is positioned in the image field in the image plane 13. When the projection exposure apparatus 1 is operated, the pattern on the reticle 12 is projected onto an illumination-light sensitive coating of the wafer 15 which may then be developed such as to allow fabrication of the microstructured component.

The following tables contain the optical data of the illumination light-guiding components of the EUV projection exposure apparatus. Table 1 specifies the radii of apex curvature (radius) of the individual components as well as the relative distances (thickness) of the components relative to each other, starting from the object plane 5 (object, thickness=0). In addition to that, line "GI morror", which refers to the grazing incidence mirror 17, includes the values "decenter" and "tilt" according to the sign convention of the optical design program Code V®.

TABLE 1

| Surface | Radius | Thickness | Mode | Decenter | Tilt [°] |
|---|---|---|---|---|---|
| Image | INFINITY | 325.999 | | | |
| Mirror 6 | −359.268 | −280.886 | REFL | | |
| Mirror 5 | −429.099 | 1154.993 | REFL | | |
| Mirror 4 | −909.435 | −610.395 | REFL | | |
| Mirror 3 | −437.104 | 222.873 | REFL | | |
| STOP | INFINITY | 317.050 | | | |
| Mirror 2 | −8781.403 | −815.959 | REFL | | |
| Mirror 1 | 1609.608 | 800.000 | REFL | | |
| GI-Mirror | INFINITY | −387.357 | REFL | 200.000 | 70.000 |
| Object | INFINITY | 0.000 | | | |

Table 2 specifies the coefficients K and A to G which define the precise surface shape of the reflecting surfaces of the six mirrors M1 to M6.

TABLE 2

| Surface | K | A | B | C |
|---|---|---|---|---|
| Mirror 6 | 5.271143E−02 | 0.000000E+01 | −4.504070E−16 | −7.946389E−21 |
| Mirror 5 | 5.542611E−00 | 0.000000E+01 | −4.554522E−13 | 2.543272E−17 |
| Mirror 4 | −1.532994E−02 | 0.000000E+01 | −2.840002E−18 | 9.637929E−24 |
| Mirror 3 | −2.709311E−00 | 0.000000E+01 | 9.736425E−15 | 1.823674E−19 |
| Mirror 2 | −3.091537E+03 | 0.000000E+01 | 9.174466E−15 | −2.131749E−19 |
| Mirror 1 | 5.053595E−01 | 0.000000E+01 | −1.391537E−17 | 2.511934E−22 |

| Surface | D | E | F | G |
|---|---|---|---|---|
| Mirror 6 | 2.493033E−25 | −1.349718E−29 | 2.221125E−34 | 0.000000E+01 |
| Mirror 5 | −2.108779E−20 | 8.819026E−24 | −1.288943E−27 | 0.000000E+01 |
| Mirror 4 | −4.597247E−29 | 9.667417E−35 | −8.456606E−41 | 0.000000E+01 |
| Mirror 3 | −5.850220E−24 | 1.980520E−28 | −3.459771E−34 | 0.000000E+01 |
| Mirror 2 | 3.438135E−24 | −1.841698E−51 | −7.176518E−34 | 0.000000E+01 |
| Mirror 1 | −1.936625E−27 | 8.219554E−33 | −1.444846E−38 | 0.000000E+01 |

The sag z at the point having the distance h from the z-axis ($h^2 = x^2 + y^2$) is obtained by way of the following formula, wherein the z-axis coincides with the axis of rotational symmetry of the respective surface:

$$z = \frac{ch^2}{1 + SQRT\{1 - (1+k)c^2h^2\}} + Ah^4 + Bh^6 + Ch^8 + Dh^{10} + Eh^{12} + Fh^{14} + Gh^{16} + Hh^{18} + Jh^{20}$$

According to Code V®, c refers to the apex curvature while k denotes the conical coefficient (K) in the above formula.

What is claimed is:

1. A projection objective configured to image radiation from an object field in an object plane to an image field in an image plane along an optical path, the projection objective comprising:

a grazing incidence mirror configured to provide a first bundle-guiding element, the grazing incidence mirror being downstream of the object plane along the optical path; and a normal incidence mirror disposed downstream of the grazing incidence mirror in the optical path, wherein:

the grazing incidence mirror is closer to the object plane along the optical path than any other mirror in the projection objective; and the projection objective is a microlithographic projection objective.

2. A projection objective according to claim 1, wherein the projection objective has exactly six normal incidence mirrors.

3. A projection objective according to claim 1, wherein there is an angle of greater than 20° between:

an object principal beam portion of a principal beam of a central object field point between the object field and the grazing incidence mirror; and an image principal beam portion of the principal beam directly in front of the image plane.

4. A projection objective according to claim 1, wherein the projection objective has a numerical aperture of 0.3 on the side of the image field.

5. A projection objective according to claim 1, wherein the projection objective has an image field with a surface area of at least 1 mm².

6. An apparatus, comprising:
an illumination system; and
a projection objective according to claim 1,
wherein the apparatus is a microlithographic projection exposure apparatus.

7. An apparatus according to claim 6, wherein there is an angle of less than 60° between:

an axis portion of an optical axis, the axis portion being located between a last bundle-guiding element of the illumination system and the object plane; and the image plane.

8. An apparatus according to claim 6, wherein the illumination system comprises an additional grazing incidence mirror that is the last bundle-guiding element disposed upstream of the object plane in a beam path of the illumination light.

9. An apparatus according to claim 8, wherein there is an angle less than 45° between:

an axis portion of an optical axis, the axis portion being located between a last bundle-guiding element of the illumination system and the additional grazing incidence mirror; and the image plane.

10. An apparatus according to claim 6, wherein an angle of incidence of the illumination light on the grazing incidence mirror is greater than 70°.

11. An apparatus according to claim 6, wherein the angle of incidence of the illumination light on the grazing incidence mirror is greater than 80°.

12. An apparatus according to claim 6, wherein the grazing incidence mirror has a reflecting freeform surface.

13. An apparatus according to claim 6, wherein the projection objective has a root mean square wavefront error that is less than 15 mλ.

14. An apparatus according to claim 13, wherein the root mean square wavefront error is 5 mλ.

15. A method, comprising:
using the apparatus of claim 6 to fabricate a microstructured component.

16. The method of claim 15, wherein the method comprises:

imaging a pattern of a reticle via the projection exposure apparatus onto an illumination-light sensitive coating of a wafer.

17. A projection objective configured to image radiation from an object field in an object plane to an image field in an image plane along an optical path, the projection objective comprising:

a first mirror configured that the radiation impinges at grazing incidence along the optical path, the first mirror being downstream of the object plane along the optical path; and a second mirror that the radiation impinges at a substantially normal angle along the path of the radiation, the second mirror being disposed downstream of the first mirror in the optical path, wherein:

the first mirror is closer to the object plane along the optical path than any other mirror in the projection objective; and the projection objective is a microlithographic projection objective;

a portion of the radiation that passes through a center of a pupil of the projection objective assigned to a central field point impinges on the first mirror at an angle of incidence of at least 70°; and all individual rays of the radiation in the optical path that impinge on the second mirror do so at an angle of incidence that is less than 30°.

18. The projection objective of claim 17, wherein the first mirror is configured to provide a first bundle-guiding element.

19. The projection objective of claim 17, wherein the projection objective has exactly six normal incidence mirrors.

20. The projection objective of claim 17, wherein the projection objective has a numerical aperture of 0.3 on the side of the image field.

21. The projection objective of claim 17, wherein the projection objective has an image field with a surface area of at least 1 mm².

* * * * *

UNITED STATES PATENT AND TRADEMARK OFFICE
CERTIFICATE OF CORRECTION

| | |
|---|---|
| PATENT NO. | : 8,027,022 B2 |
| APPLICATION NO. | : 12/174131 |
| DATED | : September 27, 2011 |
| INVENTOR(S) | : Johannes Zellner |

It is certified that error appears in the above-identified patent and that said Letters Patent is hereby corrected as shown below:

Column 1,
Line 8, Delete "applications" and insert --application--

Column 8,
Line 4, Delete "morror" and insert --mirror--

Signed and Sealed this
Sixth Day of December, 2011

David J. Kappos
*Director of the United States Patent and Trademark Office*